United States Patent
Wang et al.

(10) Patent No.: US 12,543,468 B2
(45) Date of Patent: Feb. 3, 2026

(54) LIGHT EMITTING DEVICE, LIGHT EMITTING SUBSTRATE AND LIGHT EMITTING APPARATUS

(71) Applicant: BOE Technology Group Co., Ltd., Beijing (CN)

(72) Inventors: Bei Wang, Beijing (CN); Guanyin Wen, Beijing (CN); Xiaobo Du, Beijing (CN); Huameng Liu, Beijing (CN); Yanjun Hao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 515 days.

(21) Appl. No.: 18/026,004

(22) PCT Filed: Jun. 20, 2022

(86) PCT No.: PCT/CN2022/099859
§ 371 (c)(1),
(2) Date: Mar. 13, 2023

(87) PCT Pub. No.: WO2023/245342
PCT Pub. Date: Dec. 28, 2023

(65) Prior Publication Data
US 2024/0298497 A1    Sep. 5, 2024

(51) Int. Cl.
*H10K 59/38* (2023.01)
*H10K 50/115* (2023.01)
*H10K 50/13* (2023.01)

(52) U.S. Cl.
CPC ........... *H10K 59/38* (2023.02); *H10K 50/131* (2023.02); *H10K 50/115* (2023.02)

(58) Field of Classification Search
CPC ................ H10K 50/13–131; H10K 59/38
See application file for complete search history.

(56) References Cited

U.S. PATENT DOCUMENTS

| | | |
|---|---|---|
| 6,284,394 B1 | 9/2001 | Arai et al. |
| 9,368,696 B1 | 6/2016 | Murofushi et al. |
| (Continued) | | |

FOREIGN PATENT DOCUMENTS

| | | |
|---|---|---|
| CN | 104282839 A | 1/2015 |
| CN | 110911447 A | 3/2020 |
| (Continued) | | |

*Primary Examiner* — Daniel P Shook
(74) *Attorney, Agent, or Firm* — WHDA, LLP

(57) ABSTRACT

A light emitting device includes: a first electrode; a second electrode disposed opposite to the first electrode; and multiple emission layers stacked between the first electrode and the second electrode. The emission layers include at least one first emission layer and at least one second emission layer. The first emission layer includes a first luminescent material, and is configured to emit a first light when driven by a current or voltage; the second emission layer includes a second luminescent material, and is configured to emit a second light when driven by the current or voltage; a luminous efficiency of the first luminescent material is greater than that of the second luminescent material; and a luminance conversion rate when performing optical excitation on color conversion materials by the first light is smaller than that when performing optical excitation on the color conversion materials by the second light.

20 Claims, 7 Drawing Sheets

(56) References Cited

U.S. PATENT DOCUMENTS

| | | |
|---|---|---|
| 2016/0118610 A1 | 4/2016 | Wang et al. |
| 2017/0194387 A1 | 7/2017 | Oh et al. |
| 2020/0091464 A1* | 3/2020 | Park ..................... H10K 50/13 |
| 2022/0093691 A1 | 3/2022 | Kim et al. |
| 2022/0384755 A1 | 12/2022 | Park et al. |

FOREIGN PATENT DOCUMENTS

| | | |
|---|---|---|
| CN | 111540766 A | 8/2020 |
| CN | 113782691 A | 12/2021 |

* cited by examiner

|  | Peak wavelength (nm) | FWHM (nm) |
|---|---|---|
| First luminescent material | 460 | 14.5 |
| Second luminescent material | 456 | 13.3 |

|  | Peak wavelength (nm) | Luminous efficiency | Luminance conversion rate-GQD | Luminance conversion rate-RQD | While light efficiency |
|---|---|---|---|---|---|
| Light emitting device A | 460 | 100% | 100% | 100% | 100% |
| Light emitting device B | 456 | 87% | 129% | 126% | 110% |
| Light emitting device C | 459 | 97% | 120% | 115% | 114% |

LIGHT EMITTING DEVICE, LIGHT EMITTING SUBSTRATE AND LIGHT EMITTING APPARATUS

TECHNICAL FIELD

The present disclosure relates to the field of display technology, in particular to a light emitting device, a light emitting substrate and a light emitting apparatus.

BACKGROUND

An organic light emitting diode (OLED) is an active light emitting device, which has the advantages of self-illumination, wide viewing angle, fast response time, high luminous efficiency, low working voltage and simple manufacturing process, and is known as the next-generation "star" light emitting device.

SUMMARY

The present disclosure provides a light emitting device, including:
a first electrode;
a second electrode disposed opposite to the first electrode; and
multiple emission layers stacked between the first electrode and the second electrode, the multiple emission layers including at least one first emission layer and at least one second emission layer;
the first emission layer includes a first luminescent material, and is configured to emit a first light when driven by a current or voltage;
the second emission layer includes a second luminescent material, and is configured to emit a second light when driven by the current or voltage;
a luminous efficiency of the first luminescent material is greater than a luminous efficiency of the second luminescent material; and
a luminance conversion rate when performing optical excitation on color conversion materials by the first light is smaller than an luminance conversion rate when performing optical excitation on the color conversion materials by the second light.

In an optional implement, a triplet state energy level of the first luminescent material is lower than a triplet state energy level of the second luminescent material.

In an optional implement, a difference between the triplet state energy level of the second luminescent material and the triplet state energy level of the first luminescent material is greater than or equal to 0.1 eV, and less than or equal to 0.3 eV.

In an optional implement, a molecular mass of the first luminescent material is greater than a molecular mass of the second luminescent material.

In an optional implement, a peak wavelength of the first light is greater than a peak wavelength of the second light.

In an optional implement, the peak wavelength of the first light is greater than or equal to 460 nm, and less than or equal to 470 nm; the peak wavelength of the second light is greater than or equal to 450 nm, and less than or equal to 460 nm.

In an optional implement, a full width at half maximum of the first light and a full width at half maximum of the second light are both less than or equal to 20 nm.

In an optional implement, the first electrode is a reflective electrode, and the second electrode is a transmissive electrode or a semi-transmissive electrode; the second emission layer is located on a side of the first emission layer close to the first electrode.

In an optional implement, the multiple emission layers include at least two first emission layers, and the at least one second emission layer is located on a side of the at least two first emission layers close to the first electrode.

In an optional implement, the light emitting device further includes at least one of: a hole injection layer, a hole transport layer, an electron blocking layer, a hole blocking layer, a charge generation layer, an electron transport layer, and an electron injection layer stacked between the first electrode and the second electrode.

In an optional implement, the first electrode is an anode, the second electrode is a cathode, and the light emitting device further includes:
a hole injection layer, a first hole transport layer, and a first electron blocking layer stacked between the first electrode and the multiple emission layers, the hole injection layer being disposed close to the first electrode;
a first hole blocking layer, a first charge generation layer, a second hole transport layer and a second electron blocking layer stacked between two adjacent emission layers, and the first hole blocking layer is disposed close to the first electrode;
a second hole blocking layer, an electron transport layer, and an electron injection layer stacked between the multiple emission layers and the second electrode, the electron injection layer being disposed close to the second electrode; and
a capping layer disposed on a side of the second electrode facing away from the first electrode.

In an optional implement, the first luminescent material and the second luminescent material both include at least one of: organic electroluminescent materials and quantum dots.

The present disclosure provides a light emitting substrate, including:
a first base substrate;
a plurality of switching elements disposed on the first base substrate; and
multiple light emitting devices described above and connected to the switching elements.

In an optional implement, the light emitting substrate further includes:
a thin film encapsulation layer disposed on a side of the light emitting device facing away from the first base substrate, and an orthographic projection of the thin film encapsulation layer on the first base substrate covers the first base substrate.

In an optional implement, the light emitting substrate further includes:
a color conversion layer disposed on a light emitting side of the light emitting device, wherein the color conversion layer is configured to receive incident light, and emit a light having a color different from the color of the incident light, and the incident light is the light emitted from the light emitting device.

In an optional implement, the incident light is a blue light, the light emitting substrate includes a plurality of pixels, and each of the pixels includes a red sub-pixel, a blue sub-pixel and a green sub-pixel; the color conversion layer includes at least one of:
a first color conversion pattern, located in the red sub-pixel, for emitting the red light when excited by the incident light;

a second color conversion pattern, located in the green sub-pixel, for emitting the green light when excited by the incident light; and a transmission pattern, located in the blue sub-pixel, for transmitting the incident light.

In an optional implement, the color conversion layer includes color conversion materials, and the color conversion materials include at least one of quantum dots, rare earth materials, fluorescent materials and organic dyes.

In an optional implement, the light emitting substrate further includes:

a color filter layer disposed on a light-emitting side of the color conversion layer, including:

a first color filter pattern, located in the red sub-pixel, for transmitting the red light incident to the first color filter pattern;

a second color filter pattern, located in the green sub-pixel, for transmitting the green light incident to the second color filter pattern; and a third color filter pattern, located in the blue sub-pixel, for transmitting the blue light incident to the third color filter pattern.

In an optional implement, the light emitting substrate further includes:

a second base substrate, disposed on a side of the color filter layer facing away from the color conversion layer; and a filling layer, disposed between the thin film encapsulation layer and the color conversion layer, for bonding the thin film encapsulation layer and the color conversion layer; wherein the thin film encapsulation layer is located between the light emitting device and the color conversion layer.

The present disclosure provides a light emitting apparatus, including:

the light emitting substrate described above;

a driving integrated circuit, configured to provide a driving signal to the light emitting substrate; and a power supply circuit, configured to provide power to the light emitting substrate.

The above description is only a summary of solutions of the present disclosure. In order to make technical means of the present disclosure be better understood and implemented according to the disclosure of the description, and in order to make the above and other objects, features and advantages of the present disclosure more apparent and understandable, specific embodiments of the present disclosure are illustrated below.

BRIEF DESCRIPTION OF THE DRAWINGS

In order to more clearly illustrate technical solutions of embodiments of the present disclosure or the related art, drawings that need to be used in the description of the embodiments or the related art are briefly introduced below. Apparently, the drawings described below illustrate some embodiments of the present disclosure, those skilled in the art can also obtain other drawings based on these drawings without paying any creative labor. It should be noted that the scales in the drawings are only for illustration and do not represent actual scales.

DETAILED DESCRIPTION

Figure 1:
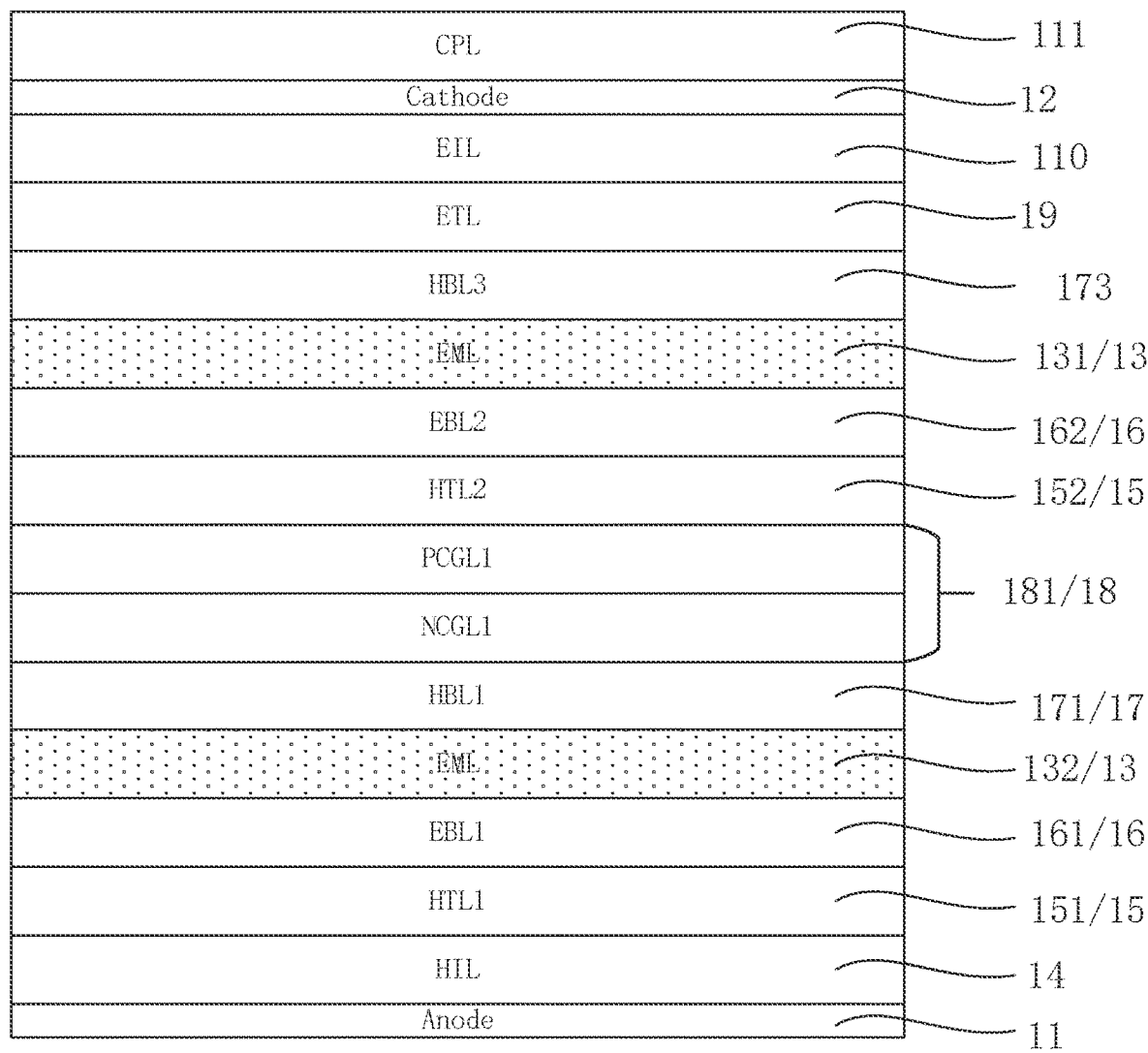
FIG. 1 is a cross-sectional structure schematic diagram schematically illustrating a first light emitting device provided by the present disclosure.

To make the objectives, technical solutions and advantages of the embodiments of the present application clearer, the technical solutions of the embodiments of the present application will be clearly, thoroughly described below with reference to the accompanying drawings of the embodiments of the present application. Apparently, only a part of the embodiments, not all the embodiments of the present application, are described. All other embodiments obtained, based on the embodiments described in the present application, by those skilled in the art without paying creative efforts shall fall within the protection scope of the present application.

The present disclosure provides a light emitting device. A cross-sectional structure schematic diagram of the light emitting device provided in the present disclosure is schematically shown with reference to FIG. 1 to FIG. 6. As shown in FIG. 1 to FIG. 6, the light emitting device includes: a first electrode 11; a second electrode 12 disposed opposite to the first electrode 11; and multiple emission layers 13 stacked between the first electrode 11 and the second electrode 12. The multiple emission layers 13 include at least one first emission layer 131 and at least one second emission layer 132.

The first emission layer 131 includes a first luminescent material, and is configured to emit a first light when driven by the current or voltage. The second emission layer 132 includes a second luminescent material, and is configured to emit a second light when driven by the current or voltage.

The luminous efficiency of the first luminescent material is greater than that of the second luminescent material, and the luminance conversion rate when performing optical excitation on color conversion materials by the first light is smaller than the luminance conversion rate when performing the optical excitation on the color conversion materials by the second light.

The first electrode 11 and the second electrode 12 are configured to supply current or voltage to the multiple emission layers 13.

The luminous efficiency of the first luminescent material refers to a ratio of the luminous flux of the light emitted by the first luminescent material (i.e., the first light) to the electric power consumed. The luminous efficiency of the second luminescent material refers to a ratio of the luminous flux of the light emitted by the second luminescent material (i.e., the second light) to the electric power consumed.

The luminance conversion rate when performing the optical excitation on the color conversion materials by the first light refers to a ratio of the luminance of the light emitted by the color conversion materials when being irradiated by the first light to the luminance of the first light, that is, a first luminance conversion rate.

The luminance conversion rate when performing the optical excitation on the color conversion materials by the second light refers to a ratio of the luminance of the light emitted by the color conversion materials when being irradiated by the second light to the luminance of the second light, that is, a second luminance conversion rate.

When the same color conversion material is irradiated by the first light and the second light respectively, the first luminance conversion rate is smaller than the second luminance conversion rate.

In the light emitting device provided by the present disclosure, at least two emission layers 13 in the multiple emission layers 13 adopt different luminescent materials. For example, the first emission layer 131 adopts the first luminescent material, and the second emission layer 132 adopts the second luminescent material. Since the first luminescent material has high luminous efficiency and the second luminescent material has high luminance conversion rate, when the light emitting device provided by the present disclosure is used to irradiate the color conversion material, not only the light emitting device per se is ensured to have a high luminous efficiency, but also the luminance conversion rate when performing the optical excitation on the color conversion material by the light emitting device can be effectively improved. Therefore, the contradiction in the related art between the high luminous efficiency of the light emitting device and the high luminance conversion rate when performing the optical excitation on the color conversion materials is solved.

Compared with the solution in which multiple emission layers 13 in the light emitting device all adopt the same luminescent material (for example the first luminescent material or the second luminescent material), the light emitting device provided in the embodiments of the present disclosure can improve the white light efficiency of the color conversion material.

The light emitting device is electrically driven to emit light, and the color conversion material is light-driven to emit light. In a combined device of a light emitting device and a color conversion material, the color conversion material emits light when excited by the light emitted by the light emitting device. In this case, the white light efficiency of the color conversion material refers to a ratio of the luminance of white light (for example, including red light, blue light and green light) emitted by the color conversion material to the current density for driving the light emitting device to emit light.

Figure 2:
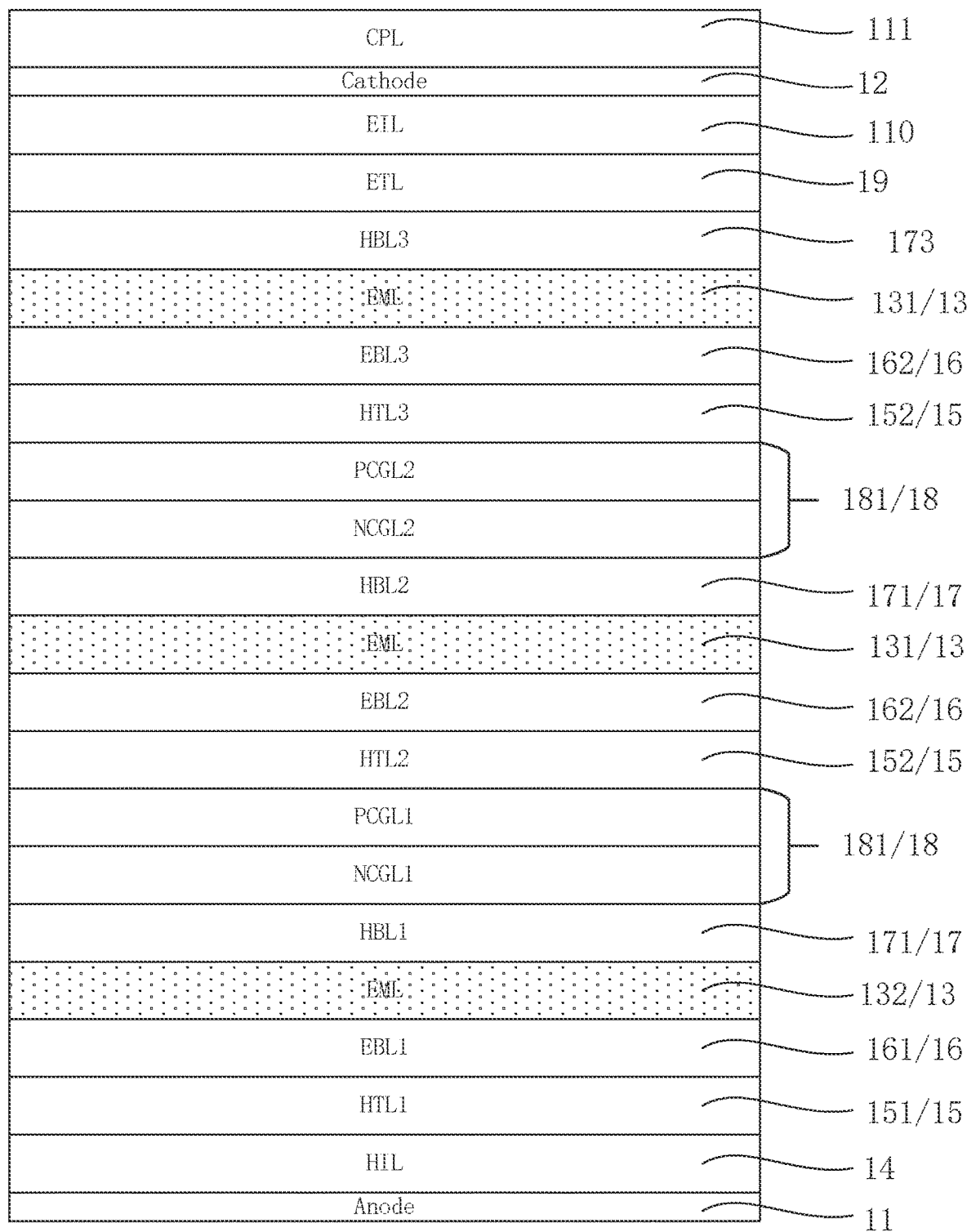
FIG. 2 is a cross-sectional structure schematic diagram schematically illustrating a second light emitting device provided by the present disclosure.
Figure 3:
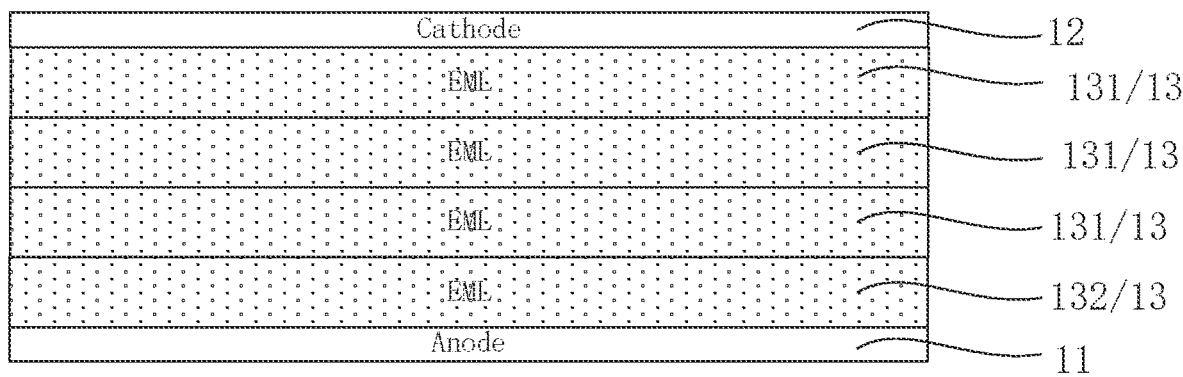
FIG. 3 is a cross-sectional structure schematic diagram schematically illustrating a third light emitting device provided by the present disclosure.
Figure 4:
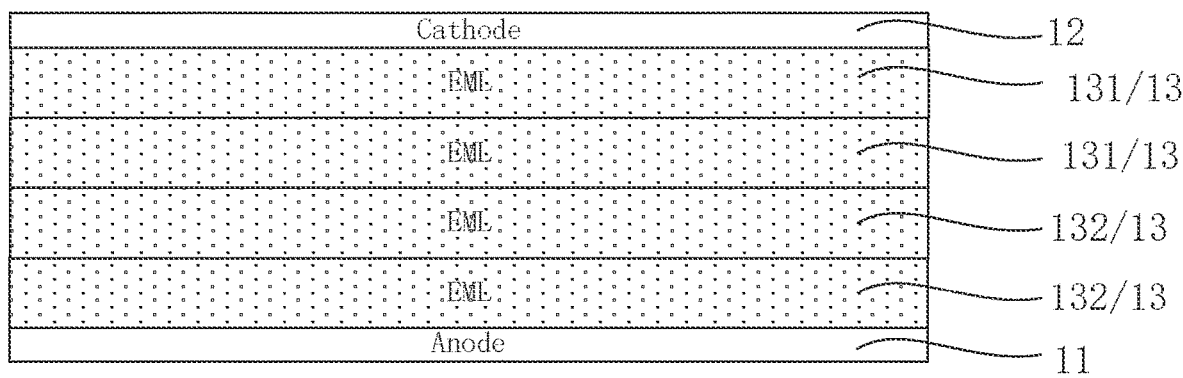
FIG. 4 is a cross-sectional structure schematic diagram schematically illustrating a fourth light emitting device provided by the present disclosure.
Figure 5:
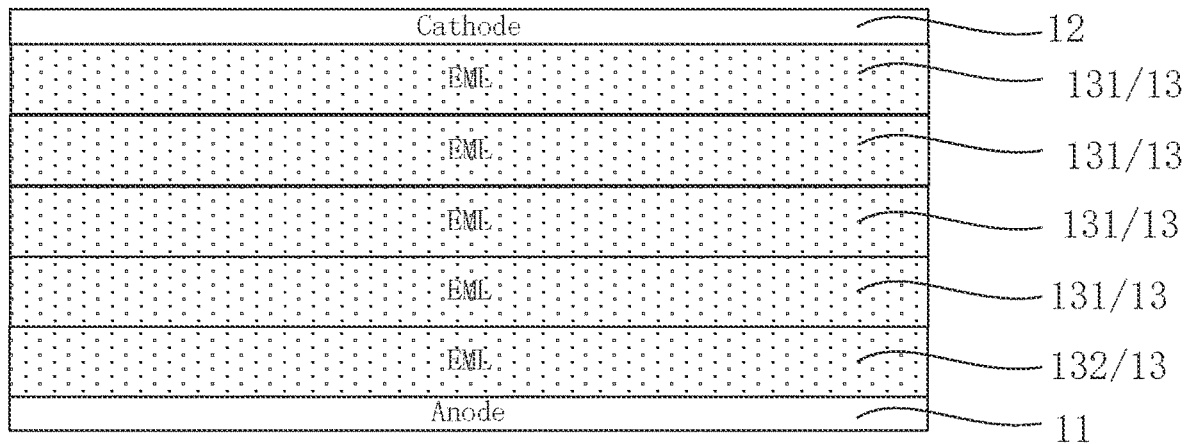
FIG. 5 is a cross-sectional structure schematic diagram schematically illustrating a fifth light emitting device provided by the present disclosure.
Figure 6:
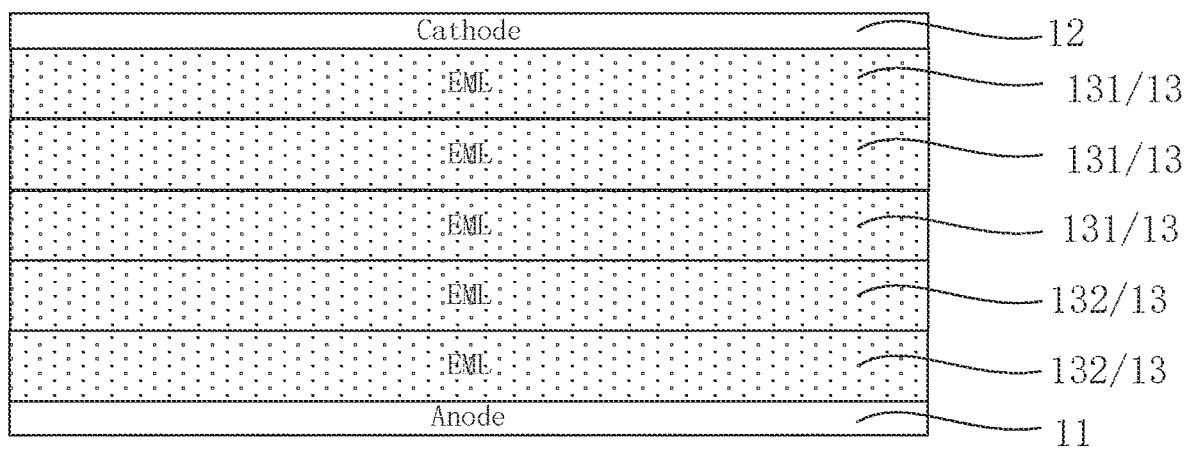
FIG. 6 is a cross-sectional structure schematic diagram schematically illustrating a sixth light emitting device provided by the present disclosure.

In specific implementations, the multiple emission layers may include one first emission layer 131 and one second emission layer 132 stacked, as shown in FIG. 1; or the multiple emission layers include two first emission layers 131 and one second emission layer 132 stacked, as shown in FIG. 2; or the multiple emission layers include three first emission layers 131 and one second emission layer 132 stacked, as shown in FIG. 3; or the multiple emission layers include two first emission layers 131 and two second emission layers 132 stacked, as shown in FIG. 4; or the multiple emission layers include four first emission layers 131 and one second emission layer 132 stacked, as shown in FIG. 5; or the multiple emission layers include three first emission layers 131 and two second emission layers 132 stacked, as shown in FIG. 6 and so on.

The number of the first emission layers 131 and the number of the second emission layers 132 included in the multiple emission layers, and a stacking order of the multiple emission layers can be designed according to actual needs, which is not limited in the present disclosure.

Optionally, the triplet state energy level of the first luminescent material is lower than that of the second luminescent material. In this way, the exciton annihilation caused by triplet state energy transfer between different emission layers 13 can be avoided, and the utilization rate of triplet state excitons of the first luminescent material and the second luminescent material can be improved.

Exemplarily, the difference between the triplet state energy level of the second luminescent material and the triplet state energy level of the first luminescent material is greater than or equal to 0.1 eV, and less than or equal to 0.3 eV. Further, the difference between the triplet state energy level of the second luminescent material and the triplet state energy level of the first luminescent material may be 0.2 eV.

Optionally, the molecular conjugative property of the first luminescent material is higher, and the molecular conjugative property of the second luminescent material is smaller. In specific implementations, the molecular conjugative property can be characterized by molecular mass. Materials with high molecular conjugative property generally have larger molecular mass, and materials with small molecular conjugative property generally have small molecular mass.

Optionally, the molecular mass of the first luminescent material is greater than the molecular mass of the second luminescent material.

Optionally, a peak wavelength of the first light emitted by the first luminescent material is greater than a peak wavelength of the second light emitted by the second luminescent material.

Optionally, the peak wavelength of the first light is greater than or equal to 460 nm and less than or equal to 470 nm; the peak wavelength of the second light is greater than or equal to 450 nm and less than or equal to 460 nm.

Optionally, the full width at half maximum (FWHM) of the first light and the FWHM of the second light are both less than or equal to 20 nm, so as to improve the color purity of the first light and the second light.

Optionally, the first electrode 11 is a reflective electrode, and the second electrode 12 is a transmissive electrode or a semi-transmissive electrode. Accordingly, as shown in FIG. 1 to FIG. 6, the second emission layer 132 is located on a side of the first emission layer 131 close to the first electrode 11.

Since the first electrode 11 is a reflective electrode, and the second electrode 12 is a transmissive electrode or a semi-transmissive electrode, in this way, the multiple emission layers 13 are located in a resonant cavity formed by a reflective film (that is, the reflective electrode: the first electrode 11) and a transmissive film (that is, a transmissive electrode or a semi-transmissive electrode: the second electrode 12), that is, a microcavity structure is formed between the reflective film and the transmissive film.

Since the luminous efficiency of the second emission layer 132 is lower than that of the first emission layer 131, among the multiple emission layers 13, the second emission layer 132 is disposed close to the first electrode 11, so that the second emission layer 132 with lower luminous efficiency is closer to the reflective film in the microcavity structure. The luminance conversion rate when performing the optical excitation on the color conversion material by the light emitting device can be improved with little impact on the overall luminous efficiency of the light emitting device, and the white light efficiency can be further optimized.

Since the luminous efficiency of the first emission layer 131 is higher, among the multiple emission layers 13, the first emission layer 131 is disposed far away from the first electrode 11, so that the first emission layer 131 with higher luminous efficiency is far away from the reflective film in the microcavity structure. Therefore, it helps to improve the overall luminous efficiency of the light emitting device.

In some exemplary embodiments, the multiple emission layers 13 may include at least two first emission layers 131 and at least one second emission layer 132. In this case, at least one second emission layer 132 is located on a side of the at least two first emission layers 131 close to the first electrode 11.

Exemplarily, as shown in FIG. 1, the multiple emission layers 13 include one first emission layer 131 and one second emission layer 132, and the second emission layer 132 is located on a side of the first emission layer 131 close to the first electrode 11. That is, the first electrode 11, the second emission layer 132, the first emission layer 131 and the second electrode 12 are stacked in sequence.

As shown in FIG. 2 to FIG. 6, when the multiple emission layers 13 include multiple first emission layers 131 and one or more second emission layers 132, the one or more second emission layers 132 are located on a side of the multiple first emission layers 131 close to the first electrode 11.

Exemplarily, as shown in FIG. 2, the multiple emission layers 13 include two first emission layers 131 and one second emission layer 132, and the second emission layer 132 is located on a side of the two first emission layers 131 close to the first electrode 11. That is, the first electrode 11, the second emission layer 132, the two first emission layers 131 and the second electrode 12 are stacked in sequence.

Exemplarily, as shown in FIG. 3, the multiple emission layers 13 include three first emission layers 131 and one second emission layer 132, and the second emission layer 132 is located on a side of the three first emission layers 131 close to the first electrode 11. That is, the first electrode 11, the second emission layer 132, the three first emission layers 131 and the second electrode 12 are stacked in sequence.

Exemplarily, as shown in FIG. 4, the multiple emission layers 13 include two first emission layers 131 and two second emission layers 132, and the two second emission layers 132 are located on a side of the two first emission layers 131 close to the first electrode 11. That is, the first electrode 11, the two second emission layers 132, the two first emission layers 131 and the second electrode 12 are stacked in sequence.

Exemplarily, as shown in FIG. 5, the multiple emission layers 13 include four first emission layers 131 and one second emission layer 132, and the second emission layer 132 is located on a side of the four first emission layers 131 close to the first electrode 11. That is, the first electrode 11, the second emission layer 132, the four first emission layers 131 and the second electrode 12 are stacked in sequence.

Exemplarily, as shown in FIG. 6, the multiple emission layers 13 include three first emission layers 131 and two second emission layers 132, and the two second emission layers 132 are located on a side of the three first emission layers 131 close to the first electrode 11. That is, the first electrode 11, the two second emission layers 132, the three first emission layers 131 and the second electrode 12 are stacked in sequence.

In specific implementations, the stacked structure of the second emission layers 132 and the first emission layers 131 is not limited to those described above. For example, the second emission layers 132 and the first emission layers 131 can also be alternately arranged between the first electrode 11 and the second electrodes 12, the second emission layers 132 are located on the side of the first emission layers 131 close to the first electrode 11; the second emission layers 132 can also be located on the side of the first emission layers 131 close to the second electrode 12, etc, which is not limited in the present disclosure.

Optionally, as shown in FIG. 1 or FIG. 2, the light emitting device further includes one or more functional film layers stacked between the first electrode 11 and the second electrode 12, such as a hole injection layer 14, a hole transport layer 15, an electron blocking layer 16, a hole blocking layer 17, a charge generation layer 18, an electron transport layer 19 and an electron injection layer 110.

One or more of the above functional film layers can be stacked between the first electrode 11 and the multiple emission layers 13, or can be stacked between two adjacent emission layers 13, or can be stacked between the multiple emission layers 13 and the second electrode 12, which can be specifically designed according to actual needs.

Exemplarily, the charge generation layer 18 may be arranged between any two adjacent emission layers 13, and multiple emission layers 13 may be connected in series through the charge generation layer 18 to form a tandem light emitting device.

In a tandem light emitting device, the charge generation layer 18 can inject carriers (such as holes or electrons) into an adjacent emission layer 13. For a certain emission layer 13, a part of carriers is provided by the first electrode 11 and the second electrode 12, and another part of carriers is generated in the charge generation layer 18. Therefore, by providing the charge generation layer 18, the lifetime of the light emitting device can be improved while reducing power consumption.

Optionally, the first electrode 11 is an anode, and the second electrode 12 is a cathode.

Optionally, as shown in FIG. 1 or FIG. 2, the light emitting device further includes a hole injection layer 14, a first hole transport layer 151 and a first electron blocking layer 161 stacked between the first electrode 11 and the multiple emission layers 13, and the hole injection layer 14 is disposed close to the first electrode.

Optionally, as shown in FIG. 1 or FIG. 2, the light emitting device further includes a first hole blocking layer 171, a first charge generation layer 181, a second hole transport layer 152 and a second electron blocking layer 162 stacked between two adjacent emission layers, and the first hole blocking layer 171 is disposed close to the first electrode 11. The first charge generation layer 181 includes an N-type charge generation layer and a P-type charge generation layer, and the N-type charge generation layer is disposed close to the first electrode 11.

Optionally, as shown in FIG. 1 or FIG. 2, the light emitting device further includes a second hole blocking layer 173, an electron transport layer 19 and an electron injection layer 110 stacked between the multiple emission layers and the second electrode, and the electron injection layer 110 is disposed close to the second electrode.

Optionally, as shown in FIG. 1 or FIG. 2, the light emitting device further includes a capping layer (CPL) disposed on a side of the second electrode 12 facing away from the first electrode 11.

The light emitting device shown in FIG. 1 includes two emission layers 13, and is a two-stack tandem light emitting device. The light emitting device shown in FIG. 2 includes three emission layers 13, and is a three-stack tandem light emitting device. The light emitting devices shown in FIG. 3 and FIG. 4 include four emission layers 13, and are four-stack tandem light emitting devices. The light emitting devices shown in FIG. 5 and FIG. 6 include five emission layers 13, and are five-stack tandem light emitting devices. Compared with a single-emission-layer device, multi-stack tandem light emitting devices can effectively improve the luminous efficiency of the device.

Figures 7, 8, 9:
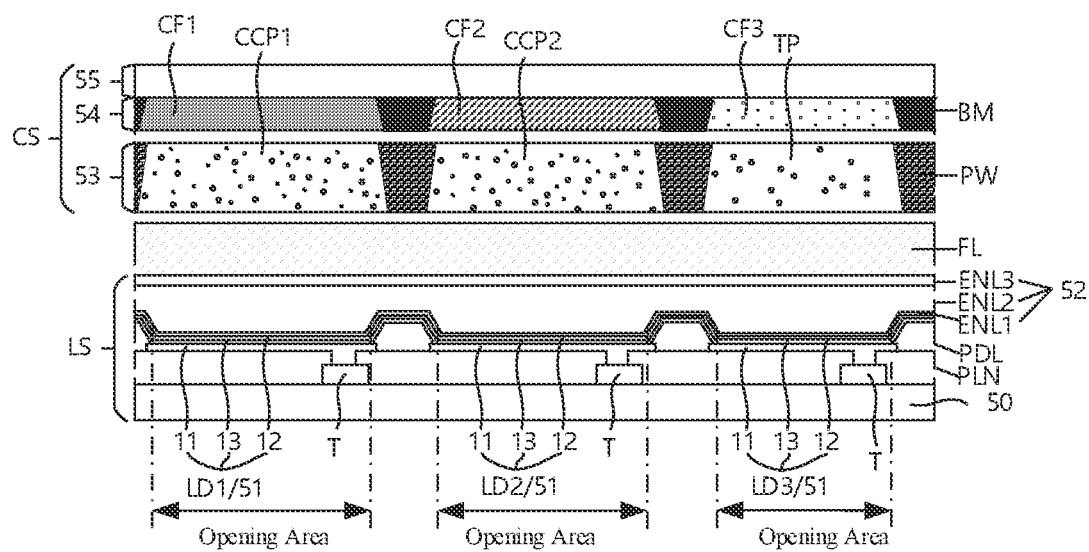
FIG. 7 schematically shows spectrum test results of a first luminescent material and a second luminescent material.
FIG. 8 schematically shows performance test results of several light emitting devices.
FIG. 9 is a cross-sectional structure schematic diagram schematically illustrating a first light emitting substrate provided by the present disclosure.

FIG. 7 schematically shows spectrum test results of the first luminescent material and the second luminescent material. As shown in FIG. 7, the peak wavelength of the first light emitted by the first luminescent material is 460 nm, and the full width at half maximum of the first light is 14.5 nm; the peak wavelength of the second light emitted by the second luminescent material is 456 nm, and the full width at half maximum of the second light is 13.3 nm.

It should be noted that, FIG. 7 shows the spectral test data when the first emission layer 131 adopting the first luminescent material and the second emission layer 132 adopting the second luminescent material have the highest interference enhancement in their respective microcavities.

In order to compare the performance of light emitting devices, the inventors tested the performance of three light emitting devices (including light emitting device A, light emitting device B and light emitting device C), respectively, and the test results are shown in FIG. 8. The light emitting device A, the light emitting device B and the light emitting device C are all three-stack tandem light emitting devices. Light emitting devices A and B are comparative examples, and light emitting device C is an experimental example. The three emission layers 13 in light emitting device A are all first emission layers 131, and the three emission layers 13 in light emitting device B are all second emission layers 132. The structure of light emitting device C is shown in FIG. 2.

As can be seen from the peak wavelength column in FIG. 8, the peak wavelength of the light emitted by the light emitting device A is 460 nm; the peak wavelength of the light emitted by the light emitting device B is 456 nm; the peak wavelength of the light emitted by the light emitting device C is 459 nm.

As can be seen from the luminous efficiency column in FIG. 8, in the case that the current density is the same and the luminous efficiencies is normalized by using the luminous efficiency of the light emitting device A as a base, the luminous efficiency of the light emitting device A is 100%, and the luminous efficiency of the light emitting device B is 87%, and the luminous efficiency of the light emitting device C is 97%.

The light emitting device A, the light emitting device B and the light emitting device C are respectively used to perform optical excitation on the color conversion materials such as the quantum dot film layer, and the measured results are shown in the luminance conversion rate column of FIG. 8. The quantum dot film layer includes green quantum dots GQD and red quantum dots RQD.

In the luminance conversion rate column in FIG. 8, the luminance conversion rates are normalized with the luminance conversion rate, when performing the optical excitation on the green quantum dot GQD by the light emitted from the light emitting device A, as a base. In this case, the luminance conversion rates, when performing the optical excitations on the green quantum dots GQD and the red quantum dots RQD by the light emitted from the light emitting device A, are both 100%.

The luminance conversion rate, when performing the optical excitation on the green quantum dot GQD by the light emitted from the light emitting device B, is 129%, and the luminance conversion rate, when performing the optical excitation on the red quantum dot RQD by the light emitted from the light emitting device B, is 126%.

The luminance conversion rate, when performing the optical excitation on the green quantum dot GQD by the light emitted by the light emitting device C, is 120%, and the luminance conversion rate, when performing the optical excitation on the red quantum dot RQD by the light emitted by the light emitting device C, is 115%.

As can be seen from the white light efficiency column in FIG. 8, the white light efficiencies are normalized by using the white light efficiency of the light emitting device A as a base, in this case, the white light efficiency of the light emitting device A is 100%, the white light efficiency of the light emitting device B is 110%, and the white light efficiency of the light emitting device C is 114%.

Since the emission layer in the light emitting device C is composed of the first emission layer 131 and the second emission layer 132, the luminous efficiency and the luminance conversion rate of the light emitting device can be improved at the same time. Therefore, the white light efficiency of the light emitting device C is optimal.

Further, since the second emission layer 132 is disposed close to the first electrode 11 (as shown in FIG. 2), the luminance conversion rate when performing the optical excitation on the conversion material by the light emitting device can be improved with little influence on the overall luminous efficiency of the light emitting device, and the optimal white light efficiency is achieved.

Optionally, both the first luminescent material and the second luminescent material include at least one of the following: organic electroluminescent material and quantum dots.

Exemplarily, both the first luminescent material and the second luminescent material are organic electroluminescent materials. Correspondingly, the light emitting device is an organic light emitting diode (OLED).

Exemplarily, both the first luminescent material and the second luminescent material are quantum dots. Correspondingly, the light emitting device is a quantum dot light emitting diode (QLED).

It should be noted that in the actual process, due to the limitation of process conditions or other factors, the sameness of the above-mentioned features cannot be completely the same, and there may be some deviations. Therefore, the same relationship between the above-mentioned features only needs to roughly meet the above-mentioned conditions, that is, all belong to the protection scope of the present disclosure. For example, the above-mentioned identity may be the identity allowed within the error tolerance range.

Figure 10:
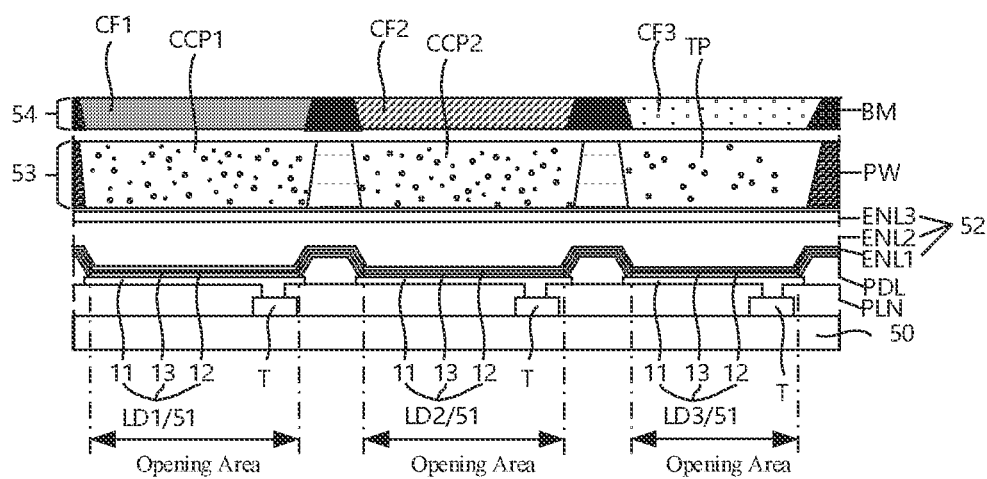
FIG. 10 is a cross-sectional structure schematic diagram schematically illustrating a second light emitting substrate provided by the present disclosure.

The present disclosure further provides a light emitting substrate. As shown in FIG. 9 or FIG. 10, the light emitting substrate includes a first base substrate 50, a plurality of switching elements T and a plurality of light emitting devices 51 as provided in any one of the above embodiments, and the light emitting devices 51 are connected with the switching elements T.

Those skilled in the art can understand that the light emitting substrate has the advantages of the previous light emitting devices.

Optionally, as shown in FIG. 9 or FIG. 10, the light emitting substrate may further include a thin film encapsulation layer 52 disposed on a side of the plurality of light emitting devices 51 facing away from the first base substrate 50.

Optionally, an orthographic projection of the thin film encapsulation layer 52 on the first base substrate 50 covers the first base substrate 50.

Optionally, as shown in FIG. 9 or FIG. 10, the thin film encapsulation layer 52 may include a first inorganic layer ENL1, an organic layer ENL2 and a second inorganic layer ENL3 that are stacked.

Optionally, as shown in FIG. 9 or FIG. 10, the light emitting substrate may further include a color conversion layer 53 disposed on the light-emitting side of the light emitting device 51. The color conversion layer 53 is configured to receive incident light, and emit a light, a color of which is different from the incident light, the incident light is the light emitted by the light emitting device 51.

When the light emitting substrate includes the thin film encapsulation layer 52 and the color conversion layer 53, as shown in FIG. 9 or FIG. 10, the color conversion layer 53 is located on a side of the thin film encapsulation layer 52 facing away from the first base substrate 50.

Figure 11:
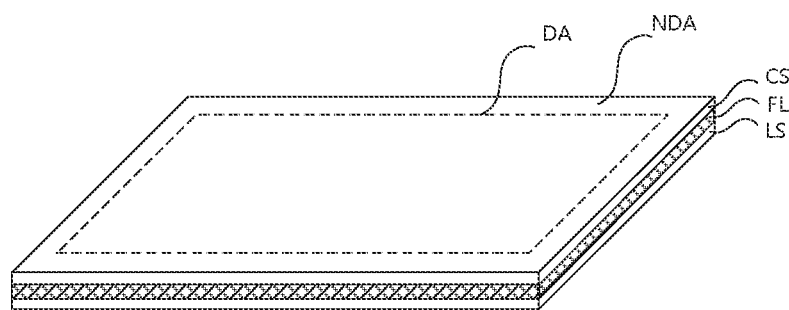
FIG. 11 is a planar construction schematic diagram schematically illustrating a light emitting substrate provided by the present disclosure.

Optionally, as shown in FIG. 11, the light emitting substrate includes an effective luminous area DA and a border area NDA located on at least one side of the effective luminous area. The effective luminous area DA may include a plurality of pixels, and each pixel includes a red sub-pixel R, a blue sub-pixel B and a green sub-pixel G. The cross-sectional view shown in FIG. 9 is a schematic cross-sectional structure diagram of a pixel located in the effective luminous area DA.

As shown in FIG. 9 or FIG. 10, the plurality of light emitting devices 51 may include a first light emitting device LD1 located in the red sub-pixel R, a second light emitting device LD2 located in the green sub-pixel G, and a third light emitting device LD3 located in the blue sub-pixel B. The sub-pixels and the light emitting devices 51 may be provided in one-to-one correspondence.

Optionally, the incident light is blue light, that is, the light emitted by the light emitting device 51 is blue light.

As shown in FIG. 9 or FIG. 10, the color conversion layer 53 may include a first color conversion pattern CCP1 located in the red sub-pixel R. The first color conversion pattern CCP1 is used for emitting red light when excited by the incident light.

Optionally, the orthographic projection of the first color conversion pattern CCP1 on the first base substrate 50 covers the orthographic projection of the luminous area (the opening area as shown in FIG. 9 or FIG. 10) of the light emitting device 51 at a corresponding position on the first base substrate 50.

As shown in FIG. 9 or FIG. 10, the color conversion layer 53 may include a second color conversion pattern CCP2 located in the green sub-pixel G. The second color conversion pattern CCP2 is used for emitting green light when excited by the incident light.

Optionally, the orthographic projection of the second color conversion pattern CCP2 on the first base substrate 50 covers the orthographic projection of the luminous area (the opening area as shown in FIG. 9 or FIG. 10) of the light emitting device 51 at a corresponding position on the first base substrate 50.

As shown in FIG. 9 or FIG. 10, the color conversion layer 53 may further include: a transmission pattern TP, located in the blue sub-pixel B and used for transmitting incident light.

Optionally, the orthographic projection of the transmission pattern TP on the first base substrate 50 covers the orthographic projection of the luminous area (the opening area as shown in FIG. 9 or FIG. 10) of the light emitting device at a corresponding position on the first base substrate 50.

Exemplarily, as shown in FIG. 9 or FIG. 10, the color conversion layer 53 includes partition walls PW, and a plurality of color conversion patterns located in a plurality of openings defined by the partition walls PW. The plurality of color conversion patterns include at least the first color conversion patterns CCP1, the second color conversion patterns CCP2, and the transmission pattern TP.

Figure 12:
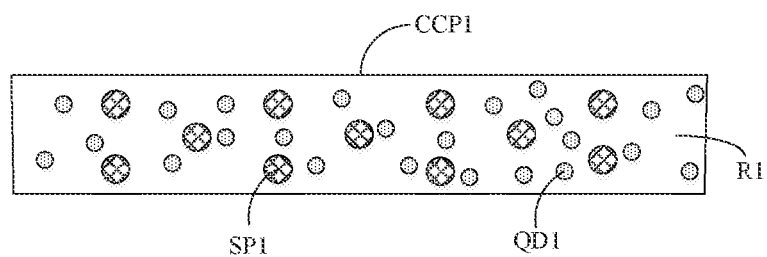
FIG. 12 is a cross-sectional structure schematic diagram schematically illustrating an example of a first color conversion pattern.

The first color conversion pattern CCP1 may emit light by converting or shifting a peak wavelength of the incident light to another specific peak wavelength. The first color conversion pattern CCP1 may convert the light L emitted from the first light emitting device LD1 into a red light having a peak wavelength in a range of about 610 nm to about 650 nm. Referring to FIG. 12, the first color conversion pattern CCP1 may include a first base resin R1 and a first color conversion material QD1 dispersed in the first base resin R1, and may also include first scattering particles SP1 dispersed in the first base resin R1.

Figure 13:
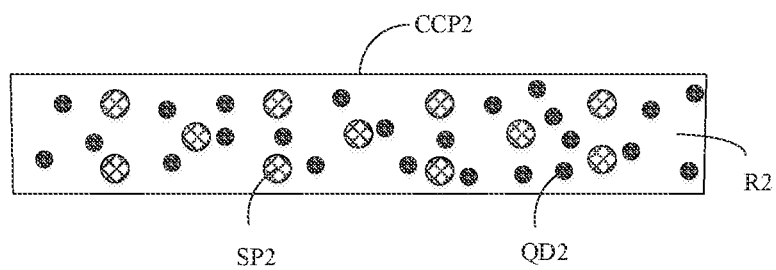
FIG. 13 is a cross-sectional structure schematic diagram schematically illustrating an example of a second color conversion pattern.

The second color conversion pattern CCP2 may emit light by converting or shifting a peak wavelength of the incident light to another specific peak wavelength. The second color conversion pattern CCP2 may convert the light L emitted from the second light emitting device LD2 into a green light having a peak wavelength in a range of about 510 nm to about 550 nm. Referring to FIG. 13, the second color conversion pattern CCP2 may include a second base resin R2 and a second color conversion material QD2 dispersed in the second base resin R2, and may also include second scattering particles SP2 dispersed in the second base resin R2.

Figure 14:
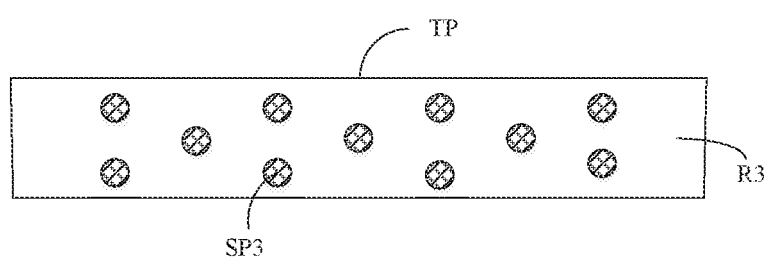
FIG. 14 is a cross-sectional structure schematic diagram schematically illustrating an example of a transmission pattern.

The transmission pattern TP can transmit the incident light, for example, has a transmissivity over 90% for the peak wavelength of the incident light. The transmission pattern TP may transmit the light L emitted from the third light emitting device LD3. Referring to FIG. 14, the transmission pattern TP may include a third base resin R3 and third scattering particles SP3 dispersed in the third base resin R3. The arrangement of the third scattering particles SP3 can expand the viewing angle range of the incident light, and improve the viewing angle uniformity among the red sub-pixel R, the blue sub-pixel B and the green sub-pixel G.

The first color conversion material QD1 and the second color conversion material QD2 may include semiconductor nanocrystalline materials, which can emit light of a certain color when electrons transit from the conduction band to the valence band. Quantum dots can have any shape as long as the shape is commonly used in the art, and specifically can be spherical, conical, multi-armed or cubic nanoparticles, or can be nanotubes, nanowires, nanofibers or nanoparticles etc.

In some embodiments, quantum dots may have a core-shell structure including a core material and a shell material. The core-shell structure includes a nanocrystalline core and a shell surrounding the core. The shell of the quantum dots can serve as a protective layer for preventing chemical modification of the core and maintaining semiconductor properties and/or a charging layer for imparting electrophoretic properties to the quantum dots. The shell may have a single-layer structure or a multi-layer structure. The interface between the core and the shell may have a concentration gradient in which the concentration of elements in the shell decreases towards the center of the core. The core of the quantum dot can be selected from a group consisting of group II-VI compounds, group III-V compounds, group IV-VI compounds, group IV elements, group IV compounds, and combinations thereof. The shell of the quantum dot may include an oxide of a metal or non-metal material, a semiconductor compound, or a combination thereof. A transition material can be added between the core material and the shell material to realize the gradual transition of the lattice, effectively reducing the internal pressure caused by the lattice defects of the quantum dots, thereby further improving the luminous efficiency and stability of the quantum dots.

In some embodiments, the group II-VI compounds can be selected from a group consisting of CdSe, CdTe, ZnS, ZnSe, ZnTe, ZnO, HgS, HgSe, HgTe, MgSe, MgS and binary compounds selected from a group formed by mixtures thereof; AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and ternary compounds selected from a group formed by mixtures thereof, and HgZnTeS, CdZnSeS, CdZnSeTe, CdZnSTe, CdHgSeS, CdHgSeTe, CdHgSTe, HgZnSeS, HgZnSeTe, HgZnSTe and quaternary compounds selected from a group formed by mixtures thereof.

In some embodiments, the group III-V compounds can be selected from a group consisting of: GaN, GaP, GaAs, GaSb, AlN, AlP, AlAs, AlSb, InN, InP, InAs, InSb and binary compounds selected from a group formed by mixtures thereof, GaNP, GaNAs, GaNSb, GaPAs, GaPSb, AlNP, AlNAs, AlNSb, AlPAs, AlPSb, InGaP, InNAs, InNP, InNAs, InNSb, InPAs, InPSb and ternary compounds selected from a group formed by mixtures thereof, and GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and quaternary compounds selected from a group formed by mixtures thereof.

In some embodiments, the group III-V compounds can be selected from a group consisting of: GaN, GaP, GaAs, GaSb, AlN, AlP, AlAs, AlSb, InN, InP, InAs, InSb and binary compounds selected from a group formed by mixtures thereof, GaNP, GaNAs, GaNSb, GaPAs, GaPSb, AlNP, AlNAs, AlNSb, AlPAs, AlPSb, InGaP, InNAs, InNP, InNAs, InNSb, InPAs, InPSb and ternary compounds selected from a group formed by mixtures thereof, and GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and quaternary compounds selected from a group formed by mixtures thereof.

In some embodiments, the transition material may be a ternary alloy material. The optical properties of quantum dots are controlled through ternary alloy materials, so as to form quantum dots with uniform volume but different light emitting frequencies, and improve the color gamut coverage of display devices.

In some embodiments, the core material of the quantum dots includes CdSe and/or InP, and the shell material includes ZnS. Take the core material including InP as an example: the surface defects of InP quantum dots form surface trap states. By coating the surface of InP quantum dots with ZnS, a core-shell structure formed with InP as the core material and ZnS as the shell material can reduce surface defects of the quantum dots, and optimize the luminous efficiency and stability of the quantum dots. Description is made above merely by taking the core material including InP as an example, the above rules are also met in the case where the core material includes CdSe, or the core material includes CdSe and InP.

In some embodiments, the quantum dot QD does not include cadmium (Cd), for example, the core material of the QD is InP, and the shell material is a stack of ZnSe/ZnS; or, for example, the core material of the QD is ZnTeSe, and the shell material is ZnSe/ZnS.

Quantum dots can have sizes less than 45 nanometers (nm), e.g, 39 nm, 30 nm, 20 nm or less. In some embodiments, the size of the quantum dot is 4 nm-20 nm, for example, it may be 4 nm, 5 nm, 7 nm, 10 nm, 13 nm, 17 nm or 20 nm. Quantum dots can adjust the color of emitted light according to their sizes, and thus quantum dots can emit light of various colors, such as blue light, red light, green light, and the like. The size of the red quantum dots and the size of the green quantum dots may be different.

The first color conversion material QD1 and the second color conversion material QD2 are not limited to the above quantum dot materials, and can also be selected from one or more color conversion materials such as quantum dots, rare earth materials, fluorescent materials and organic dyes.

When the light emitting device is an OLED, and the color conversion layer 53 is made of quantum dot material, the pixel-level control of the OLED and the color enhancement characteristics of the quantum dot can be combined to obtain better display characteristics, while reducing power consumption and prolonging the lifetime of the light emitting substrate. In addition, during the process of manufacturing multiple light emitting devices 51, the emission layers located in different sub-pixels can be formed as an entire surface. For example, an open mask can be used to simultaneously form the emission layers located in different sub-pixels, thereby simplifying the manufacturing process.

The blue OLED is used as a backlight source to excite the quantum dot material in the red sub-pixel R and the green sub-pixel G to emit red and green light. Meanwhile, the transmission pattern TP in the blue sub-pixel B scatters and transmits the incident light to emit blue light with an enlarged viewing angle. The blue light is mixed with the red light and the green light to form a white light, so that the screen display can be realized.

Optionally, as shown in FIG. 9 or FIG. 10, the light emitting device further includes: a color filter layer 54 disposed on the light-emitting side of the color conversion layer 53.

Optionally, as shown in FIG. 9 or FIG. 10, the color filter layer 54 includes a first color filter pattern CF1 that is located in the red sub-pixel R and used for transmitting the red light incident on the first color filter pattern CF1.

Optionally, as shown in FIG. 9 or FIG. 10, the color filter layer 54 includes a second color filter pattern CF2 that is located in the green sub-pixel G and used for transmitting the green light incident on the second color filter pattern CF2.

Optionally, as shown in FIG. 9 or FIG. 10, the color filter layer 54 includes a third color filter pattern CF3 that is located in the blue sub-pixel B and used for transmitting the blue light incident to the third color filter pattern CF3.

In a specific implementation, referring to FIG. 10, a plurality of switching elements T, a planar layer PLN, a first electrode 11, a pixel definition layer PDL, multiple emission layers 13, a second electrode 12, a thin film encapsulation layer 52, and a color conversion layer 53 and a color filter layer 54 may be sequentially formed on the first base substrate 50 to obtain the light emitting substrate as shown in FIG. 10.

Optionally, as shown in FIG. 9, the light emitting device further includes: a second base substrate 55 disposed on a side of the color filter layer 54 facing away from the color conversion layer 53; and a filling layer FL disposed between the thin film encapsulation layer 52 and the color conversion layer 53 for bonding the thin film encapsulation layer 52 and the color conversion layer 53.

The thin film encapsulation layer 52 is located between the multiple light emitting devices 51 and the color conversion layer 53.

In a specific implementation, a plurality of switching elements T, a planar layer PLN, a first electrode 11, a pixel definition layer PDL, multiple emission layers 13, a second electrode 12 and a thin film encapsulation layer 52 may be sequentially formed on the first base substrate 50, so as to obtain the substrate LS in the light emitting substrate as shown in FIG. 9; a color filter layer 54 and a color conversion layer 53 are sequentially formed on the second base substrate 55 to obtain the substrate CS in the light emitting substrates as shown in FIG. 9; then, the substrate LS and the substrate CS may be bonded together with the filling layer FL, and the filling layer FL is located between the thin film encapsulation layer 52 and the color conversion layer 53 to obtain the light emitting substrate shown in FIG. 9.

The present disclosure further provides a light emitting apparatus, including: the light emitting substrate according to any one of the embodiments; a driving integrated circuit, configured to provide a driving signal to the light emitting substrate; and a power supply circuit, configured to supply power to the light emitting substrate.

Those skilled in the art can understand that the light emitting apparatus has the advantages of the previous light emitting devices.

In some embodiments, the light emitting apparatus may be an illuminating apparatus, and in this case, the light emitting apparatus serves as a light source to realize the illumination function. For example, the light emitting apparatus may be a backlight module in a liquid crystal light emitting apparatus, a lamp for internal or external illumination, or various signal lamps, etc.

In some other embodiments, the light emitting device may be a display device. In this case, the light emitting device has the function of displaying an image (i.e., a picture). The light emitting device may include a display or a product including a display. The display may be a flat panel display (FPD), a micro-display, and the like. The display can be a transparent display or an opaque display according to whether the user can see the scene behind the display. According to whether the display can be bent or rolled, the display may be a flexible display or an ordinary display (which may be called as a rigid display). Exemplarily, the product containing a display may include: a computer, a television, a billboard, a laser printer with display functions, a telephone, a mobile phone, an electronic paper, a personal digital assistant (PDA), a laptop computer, a digital camera, a tablet, a laptop, a navigator, a camcorder, a viewfinder, a vehicle, large wall, theater screen or stadium signage, etc.

Various embodiments in the description are described in a progressive manner, each embodiment focuses on the difference from other embodiments, and the same and similar parts of various embodiments can be referred to each other.

Finally, it should be noted that, in the present disclosure, relationship terms such as first and second are only used to distinguish one entity or operation from another entity or operation, and do not necessarily require or imply any such actual relationship or sequence exists between these entities or operations. The terms "comprising", "including" or any other variation thereof are intended to encompass non-exclusive inclusion such that a process, method, product or device including a list of elements includes not only those elements, but also other not expressly listed elements, or also include elements inherent to such a process, method, product or device. Without further limitation, an element defined by the phrase "comprising a . . . " does not preclude the presence of additional identical elements in a process, method, product or device including the element.

The light emitting device, the light emitting substrate, and the light emitting device provided by the present disclosure have been introduced in detail above. Herein, specific examples are used to illustrate the principles and implementation methods of the present application. The descriptions of the above embodiments are only used to help understand the method and core idea of the application; meanwhile, for those skilled in the art, there will be changes in the specific implementation and scope of application based on the core idea of the application. In summary, the content of the description should not be construed as limiting the present application.

Other embodiments of the present disclosure will be apparent to those skilled in the art in view of the description and practice of the present disclosure disclosed herein. The present application is intended to cover any variations, uses, or adaptations of the present disclosure, which are consistent with the general principles of the present disclosure and include common general knowledge or conventional technical means in the art that are not disclosed in the present disclosure. The description and embodiments are illustrative, and the real scope and spirit of the present disclosure is defined by the appended claims.

It should be understood that the present disclosure is not limited to the precise structures that have been described above and shown in the drawings, and various modifications and changes can be made without departing from the scope thereof. The scope of the present disclosure is merely defined by the appended claims.

Terms such as "one embodiment", "an embodiment", or "one or more embodiments" used herein means that a particular feature, structure, or characteristic described in connection with the embodiments is included in at least one embodiment of the present disclosure. In addition, please note that examples of the phrase "in one embodiment" herein do not necessarily all refer to the same embodiment.

In the description provided herein, numerous specific details are set forth. However, it is understood that embodiments of the present disclosure may be practiced without these specific details. In some instances, well-known methods, structures and techniques have not been shown in detail so as to not obscure the understanding of this description.

In the claims, any reference signs placed between parentheses shall not be construed as limiting the claims. The phrase "comprising/including" does not exclude the presence of elements or steps not listed in the claims. The phrase "a" or "an" preceding an element does not exclude the presence of a plurality of such elements. The disclosure can be implemented by means of hardware comprising several distinct elements, and by means of a suitably programmed computer. In a unit claim enumerating several means, several of these means can be embodied by the same hardware item. The use of the words "first", "second", and "third", etc. does not indicate any order. These words can be interpreted as names.

Finally, it should be noted that the above embodiments are only used to illustrate the technical solutions of the present disclosure, but not to limit them; although the present disclosure has been described in detail with reference to the foregoing embodiments, those ordinary skilled in the art should understand that, the technical solutions described in the foregoing embodiments can still be modified, or some or all of the technical features thereof can be equivalently replaced; and these modifications or replacements do not make the essence of the corresponding technical solutions deviate from the sprits and scope of the technical solutions of the embodiments of the present disclosure.

The invention claimed is:

1. A light emitting device, comprising:
   a first electrode;
   a second electrode disposed opposite to the first electrode; and
   multiple emission layers stacked between the first electrode and the second electrode, wherein the multiple emission layers comprise at least one first emission layer and at least one second emission layer; wherein
   the first emission layer comprises a first luminescent material, and is configured to emit a first light when driven by a current or voltage;
   the second emission layer comprises a second luminescent material, and is configured to emit a second light when driven by the current or voltage;
   a luminous efficiency of the first luminescent material is greater than a luminous efficiency of the second luminescent material; and
   a luminance conversion rate when performing optical excitation on color conversion materials by the first light is smaller than a luminance conversion rate when performing optical excitation on the color conversion materials by the second light.

2. The light emitting device according to claim 1, wherein a triplet state energy level of the first luminescent material is lower than a triplet state energy level of the second luminescent material.

3. The light emitting device according to claim 2, wherein a difference between the triplet state energy level of the second luminescent material and the triplet state energy level of the first luminescent material is greater than or equal to 0.1 eV, and less than or equal to 0.3 eV.

4. The light emitting device according to claim 1, wherein a molecular mass of the first luminescent material is greater than a molecular mass of the second luminescent material.

5. The light emitting device according to claim 1, wherein a peak wavelength of the first light is greater than a peak wavelength of the second light.

6. The light emitting device according to claim 5, wherein the peak wavelength of the first light is greater than or equal to 460 nm, and less than or equal to 470 nm; the peak wavelength of the second light is greater than or equal to 450 nm, and less than or equal to 460 nm.

7. The light emitting device according to claim 1, wherein a full width at half maximum of the first light and a full width at half maximum of the second light are both less than or equal to 20 nm.

8. The light emitting device according to claim 1, wherein the first electrode is a reflective electrode, and the second electrode is a transmissive electrode or a semi-transmissive electrode; the second emission layer is located on a side of the first emission layer close to the first electrode.

9. The light emitting device according to claim 8, wherein the multiple emission layers comprise at least two first emission layers, and the at least one second emission layer is located on a side of the at least two first emission layers close to the first electrode.

10. The light emitting device according to claim 1, further comprising at least one of: a hole injection layer, a hole transport layer, an electron blocking layer, a hole blocking layer, a charge generation layer, an electron transport layer, and an electron injection layer stacked between the first electrode and the second electrode.

11. The light emitting device according to claim 1, wherein the first electrode is an anode, the second electrode is a cathode, and the light emitting device further comprises:
   a hole injection layer, a first hole transport layer, and a first electron blocking layer stacked between the first electrode and the multiple emission layers, the hole injection layer being disposed close to the first electrode;
   a first hole blocking layer, a first charge generation layer, a second hole transport layer and a second electron blocking layer stacked between two adjacent emission layers, the first hole blocking layer being disposed close to the first electrode;
   a second hole blocking layer, an electron transport layer, and an electron injection layer stacked between the multiple emission layers and the second electrode, the electron injection layer being disposed close to the second electrode; and
   a capping layer disposed on a side of the second electrode facing away from the first electrode.

12. The light emitting device according to claim 1, wherein the first luminescent material and the second luminescent material both comprise at least one of: organic electroluminescent materials and quantum dots.

13. A light emitting substrate, comprising:
   a first base substrate;
   a plurality of switching elements disposed on the first base substrate; and
   multiple light emitting devices connected to the switching elements,
   wherein each of the light emitting devices comprises: a first electrode; a second electrode disposed opposite to the first electrode; and multiple emission layers stacked between the first electrode and the second electrode, wherein the multiple emission layers comprise at least one first emission layer and at least one second emission layer; wherein
   the first emission layer comprises a first luminescent material, and is configured to emit a first light when driven by a current or voltage;
   the second emission layer comprises a second luminescent material, and is configured to emit a second light when driven by the current or voltage;
   a luminous efficiency of the first luminescent material is greater than a luminous efficiency of the second luminescent material; and a luminance conversion rate when performing optical excitation on color conversion materials by the first light is smaller than a luminance conversion rate when performing optical excitation on the color conversion materials by the second light.

14. The light emitting substrate according to claim 13, further comprising:
a thin film encapsulation layer disposed on a side of the light emitting device facing away from the first base substrate, and an orthographic projection of the thin film encapsulation layer on the first base substrate covers the first base substrate.

15. The light emitting substrate according to claim 13, further comprising:
a color conversion layer disposed on a light-emitting side of the light emitting device, wherein the color conversion layer is configured to receive incident light, and emit a light having a color different from the color of the incident light, and the incident light is the light emitted from the light emitting device.

16. The light emitting substrate according to claim 15, wherein the incident light is a blue light, the light emitting substrate comprises a plurality of pixels, and each of the pixels comprises a red sub-pixel, a blue sub-pixel and a green sub-pixel; the color conversion layer comprises at least one of:
a first color conversion pattern, located in the red sub-pixel, for emitting a red light when excited by the incident light;
a second color conversion pattern, located in the green sub-pixel, for emitting a green light when excited by the incident light; and
a transmission pattern, located in the blue sub-pixel, for transmitting the incident light.

17. The light emitting substrate according to claim 16, further comprising:
a color filter layer disposed on a light-emitting side of the color conversion layer, comprising:
a first color filter pattern, located in the red sub-pixel, for transmitting the red light incident to the first color filter pattern;
a second color filter pattern, located in the green sub-pixel, for transmitting the green light incident to the second color filter pattern; and
a third color filter pattern, located in the blue sub-pixel, for transmitting the blue light incident to the third color filter pattern.

18. The light emitting substrate according to claim 17, further comprising:
a second base substrate, disposed on a side of the color filter layer facing away from the color conversion layer; and
a filling layer, disposed between the thin film encapsulation layer and the color conversion layer, for bonding the thin film encapsulation layer and the color conversion layer; wherein the thin film encapsulation layer is located between the light emitting device and the color conversion layer.

19. The light emitting substrate according to claim 15, wherein the color conversion layer comprises color conversion materials, and the color conversion materials comprise at least one of: quantum dots, rare earth materials, fluorescent materials and organic dyes.

20. A light emitting apparatus, comprising:
the light emitting substrate according to claim 13;
a driving integrated circuit, configured to provide a driving signal to the light emitting substrate; and
a power supply circuit, configured to provide power to the light emitting substrate.

* * * * *